United States Patent [19]

Kishita et al.

[11] Patent Number: 4,674,174
[45] Date of Patent: Jun. 23, 1987

[54] METHOD FOR FORMING A CONDUCTOR PATTERN USING LIFT-OFF

[75] Inventors: Yoshihiro Kishita, Kawasaki; Motoki Furukawa, Yokohama; Tatsuro Mitani, Tokyo, all of Japan

[73] Assignee: Kabushiki Kaisha Toshiba, Kawasaki, Japan

[21] Appl. No.: 786,825

[22] Filed: Oct. 11, 1985

[30] Foreign Application Priority Data

Oct. 17, 1984 [JP] Japan .............................. 59-216316
Oct. 17, 1984 [JP] Japan .............................. 59-216317

[51] Int. Cl.⁴ .................. H01L 21/308; H01L 21/31; H01L 21/32; H01L 21/467
[52] U.S. Cl. ........................................ 29/578; 29/571; 29/580; 29/576 B; 357/15; 357/71; 357/23.9; 357/22
[58] Field of Search ............. 29/571, 580, 578, 576 B; 148/DIG. 100, 88, 139, 140, 142, 105, 106, 56; 357/15, 71, 23.9, 22 I, 22 J, 22 K

[56] References Cited

U.S. PATENT DOCUMENTS 4,448,800  5/1984  Ehara et al. ........................... 427/39
4,586,063  4/1986  Nakamura et al. ..................... 357/15

OTHER PUBLICATIONS

M. A. Nicolet, Thin Solid Films, vol. 52, pp. 415–443, 1978.
A. Armigliato, M. Finetti, A. Garulli, S. Guerri, R. Lotti and P. Ostoja, Thin Solid Films, vol. 129, pp. 55–61, 1985.
S. K. Ghandhi, VLSI Fabrication Principles, John Wiley & Sons, New York, New York, 1983.

Primary Examiner—Brian E. Hearn
Assistant Examiner—William Bunch
Attorney, Agent, or Firm—Finnegan, Henderson, Farabow, Garrett & Dunner

[57] ABSTRACT

Disclosed is a method for forming a conductor pattern which comprises the steps of forming a conductive layer on a semiconductor substrate, forming a photoresist film on the conductive layer, removing that portion of the photoresist film located on a conductor pattern forming region of the conductive layer, forming a first masking metal film over the whole surface of the resultant structure, removing the photoresist film along with that portion of the first masking metal film formed thereon so that a portion of the first masking film remains on the conductor pattern forming region of the conductive layer to form a first masking metal pattern, and selectively removing the conductive layer by anisotropic etching to form the conductor pattern.

Since the selective removal of the conductor layer is accomplished by the use of the metal pattern as a mask, it is possible to form a much finer conductor pattern than is obtained with the use of the photoresist pattern as the mask.

7 Claims, 26 Drawing Figures

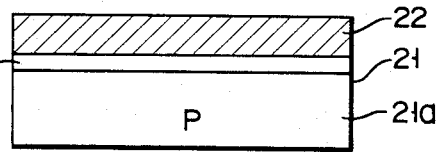
F I G. 4A
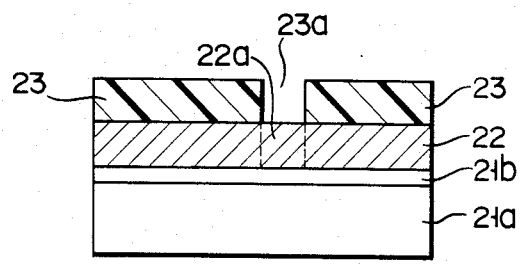
F I G. 4B
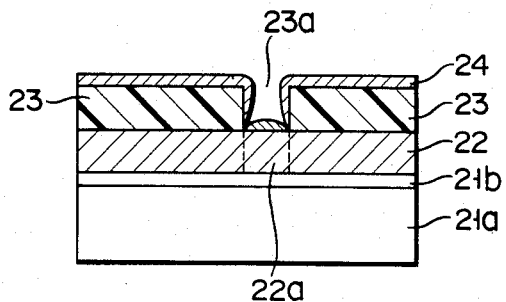
F I G. 4C

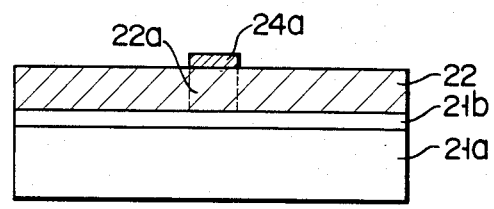
F I G. 4D
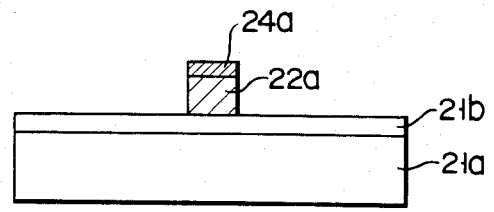
F I G. 4E
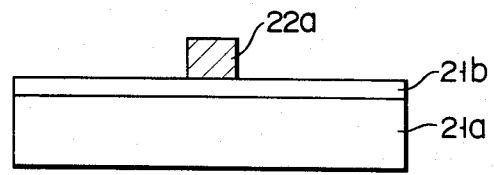
F I G. 4F
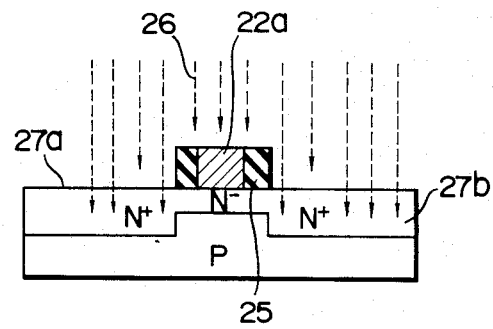
F I G. 4G

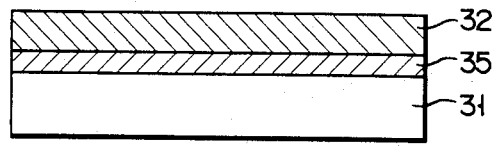
F I G. 5A
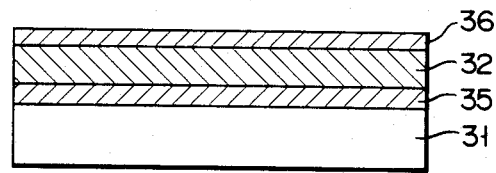
F I G. 5B
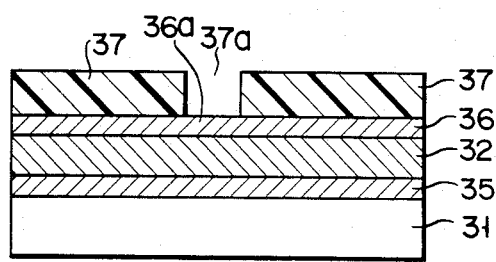
F I G. 5C
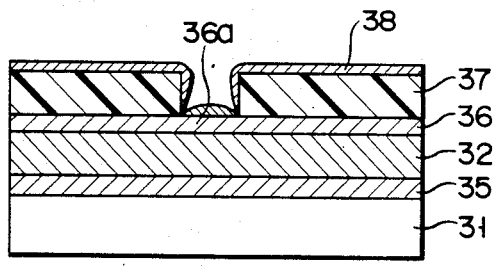
F I G. 5D F I G. 5E 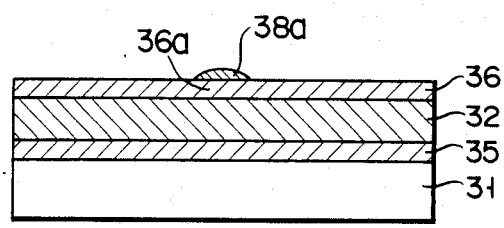
F I G. 5F 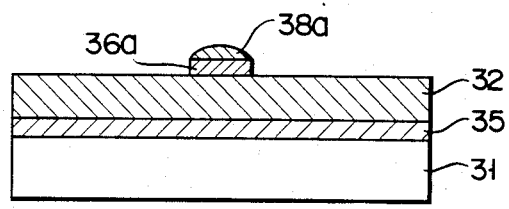
F I G. 5G 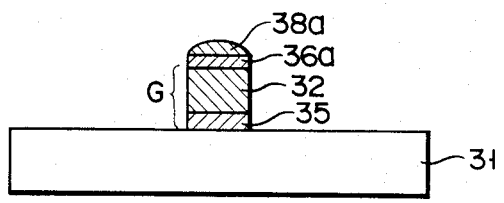
F I G. 5H 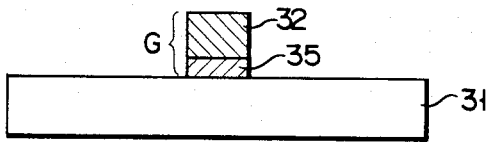

METHOD FOR FORMING A CONDUCTOR PATTERN USING LIFT-OFF

BACKGROUND OF THE INVENTION

I. Field of the Invention

The present invention relates to a method for forming a conductor pattern of a semiconductor device, and more specifically to a method for forming a gate electrode of an MESFET.

II. Description of the Prior Art

The following is an example of a prior art method for forming a conductor pattern on a semiconductor substrate. First, as shown in FIG. 1A, a metal layer 2 is formed on a semiconductor substrate 1. Then, as shown in FIG. 1B, a photoresist pattern 3 is formed on target region 2a of the metal layer 2 to carry an electrode pattern thereon. Thereafter, as shown in FIG. 1C, the metal layer 2 is subjected to reactive ion etching using the photoresist pattern 3 as a mask, thus forming a metal electrode pattern 2a. Finally, as shown in FIG. 1D, the photoresist pattern 3 is removed to leave the metal electrode pattern 2a alone on the semiconductor substrate 1.

According to this conventional method, however, the use of the photoresist pattern as the etching mask involves the following problems.

(1) The photoresist pattern 3 is not very resistant to reactive ion etching and needs to be made relatively thick. As the photoresist pattern 3 is increased in thickness, the dimensional change becomes proportionally greater. Even if the width of the photoresist pattern 3 is e.g. about 0.5 microns, the electrode pattern 2a of the metal layer 2 will sometimes spread out at the skirt so that the pattern width m at its junction with the semiconductor substrate 1 will be about 1.0 micron. When forming an electrode pattern of a thick metal layer, patterning is difficult since the etching time is so long that the photoresist is removed by etching before the electrode pattern is formed.

(2) As shown in FIGS. 2B and 2C, the photoresist pattern 3 is subjected to side etching in the directions indicated by the arrows, so that the etching effect reaches the lateral faces of the electrode pattern 2a of the metal layer, rendering the vertical section of the electrode pattern 2a trapezoidal (FIG. 2B) or semicircular (FIG. 2C) in shape. The electrode pattern subjected to such side etching would acquire higher resistivity than that of the rectangular electrode pattern. High resistivity may cause noise and poorer high-frequency characteristics.

(3) In the manufacture of a semiconductor device, processes are sometimes required after the formation of the electrode pattern 2a in which a mask film 5 is formed on the lateral faces of the electrode pattern 2a (side wall process), and the semiconductor substrate 1 is subjected to ion implantation as indicated by arrows 6 using the mask film 5 and the electrode pattern 2a as a mask (self-alignment process), as shown in FIG. 2D. If the vertical section of the electrode pattern 2a is trapezoidal or semicircular as mentioned, it is impossible to accomplish accurate self-aligning ion implantation.

(4) It is difficult to form a fine photoresist pattern with a thickness of e.g. 0.5 microns or less, since it may sometimes be dissolved away by a developing agent during the developing process, as shown in FIG. 2E. The photoresist is very resistant to etching, and even if patterned with success, it could possibly peel off during an etching process in which it is used as a mask for forming a metal electrode pattern. It is therefore very hard to form a fine metal electrode pattern using the photoresist as a mask.

The following is another prior art method forming a conductor pattern on a semiconductor substrate.

First, as shown in FIG. 3A, a gold layer 12 to form an electrode pattern and a titanium layer 13 to serve as an auxiliary mask are successively formed on a semiconductor substrate 11. Thereafter, a photoresist pattern 14 corresponding in shape to the electrode pattern to be formed is formed on the titanium layer 13.

Then, as shown in FIG. 3B, the titanium layer 13 and the gold layer 12 are selectively removed by the ion milling method using the photoresist pattern 14 as a mask. In doing this, accelerated argon particles 15 are impinged on the surface of the structure to selectively remove the titanium layer 13 first and then the gold layer 12. In removing the gold layer 12, the photoresist pattern 14 and the remaining titanium layer 13 are used as a mask. Thus, a gold electrode pattern 12a is formed.

Also in this method, the photoresist is used as a mask, so that it is impossible to form an accurate mask pattern. Accordingly, it is difficult to form a fine conductor pattern, and the dimensional change is great. When forming the electrode pattern by selectively removing the gold layer using the ion milling method, moreover, titanium or gold powder will stick to the lateral faces of the thick photoresist pattern increasing its width. If the photoresist pattern is widened in this manner, the electrode pattern is also widened, making it impossible to form a fine electrode pattern.

SUMMARY OF THE INVENTION

The object of the present invention is to provide a method for forming a conductor pattern, whereby fine conductor patterns with a rectangular vertical section can be formed with high accuracy.

According to the present invention, there is provided a method for forming a conductor pattern, which comprises the steps of forming a conductive layer on a semiconductor substrate, forming a photoresist film on the conductive layer, removing that portion of the photoresist film located on a conductor pattern forming region of the conductive layer, forming a masking metal film over the whole surface of the resultant structure, removing the photoresist film along with that portion of the masking metal film formed thereon so that a portion of the masking film remains on the conductor pattern forming region of the conductive layer to form a first masking metal pattern, and selectively removing the conductive layer by anisotropic etching to form the conductor pattern.

In the method described above, the selective removal of the conductor layer by anisotropic etching can be accomplished by the use of the first masking metal pattern as a mask. Alternatively, as described in detail later, this purpose may be achieved by using an additional masking metal pattern as a mask which is formed using the masking metal pattern as a mask.

Gold, titanium, aluminum, titanium nitride, tungsten nitride, polycrystalline silicon and various other materials may be used for the conductive layer. When using a material with relatively high resistivity, such as titanium, titanium nitride or tungsten nitride, it is possible to use a two-layer structure combining such metal and gold or other low-resistivity metal. If the conductive layer is to serve as a gate electrode of an MES transistor, it is required to form a Schottky junction with the semiconductor substrate made of e.g. gallium arsenide.

The material forming the masking metal film needs to have etching selectivity for the material of the conductive layer. Thus, gold, titanium, aluminum, tungsten, molybdenum, etc., may be used for the masking metal film.

The anisotropic etching method is selected according to the combination of the materials of the conductive layer and the masking metal film. In the case of a combination of titanium nitride for the conductive layer and titanium for the masking metal film, for example, reactive ion etching is performed using a gas mixture of carbon fluoride and oxygen as the etching gas. In the case of a combination of aluminum, titanium or polycrystalline silicon for the conductive layer and gold for the masking metal film, on the other hand, reactive ion etching is performed using a chlorine-based gas as the etching gas. Moreover, ion milling is used when gold for the conductive layer and tungsten, titanium or aluminum for the masking metal film are combined.

According to the method of the present invention described above, a metal film is used as an etching mask for patterning the conductive layer, so that the dimensional change can be reduced, and to make it possible to accurately form a fine conductor pattern with a rectangular vertical section.

In the method of the invention described above, an additional masking metal film may be formed prior to the formation of the photoresist film and patterned by anisotropic etching using the first masking metal pattern as a mask after the patterning of the masking metal film so that the conductive layer is patterned with the aid of the resulting second masking metal pattern as a mask. In this case, the second masking metal pattern is made smaller in size than the first masking metal pattern by a side etching effect produced during the patterning of the additional masking metal film. It is therefore possible to obtain a finer conductor pattern.

The material forming the additional masking metal film needs to have etching selectivity in regards to both the materials of the conductive layer and the masking metal film. Thus, gold, titanium, aluminum tungsten, molybdenum, etc., may be used for the additional masking metal film.

Reactive ion etching or ion milling may be used for the anisotropic etching method for patterning the additional masking metal film.

BRIEF DESCRIPTION OF THE DRAWINGS

FIGS. 4A to 4G are sectional views showing one embodiment of the present invention; and FIGS. 5A to 5H are sectional views showing another embodiment of the present invention.

DETAILED DESCRIPTION OF THE PREFERRED EMBODIMENTS

Figure 1A:
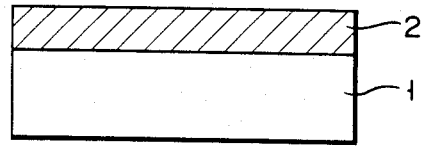
Figs. 1A to 1D are sectional views illustrating processes of a prior art method for forming a conductor pattern.
Figure 1B:
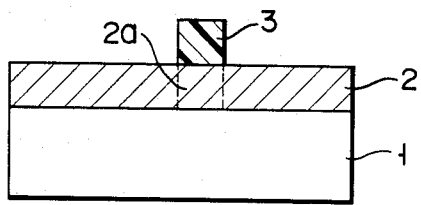
Figure 1C:
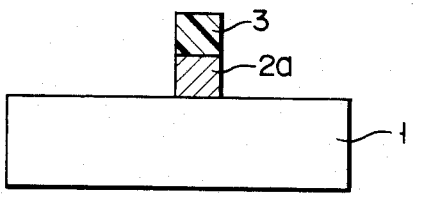
Figure 1D:
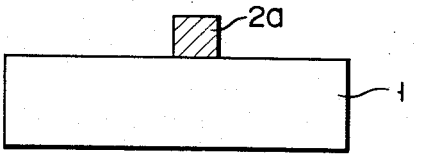
Figure 2A:
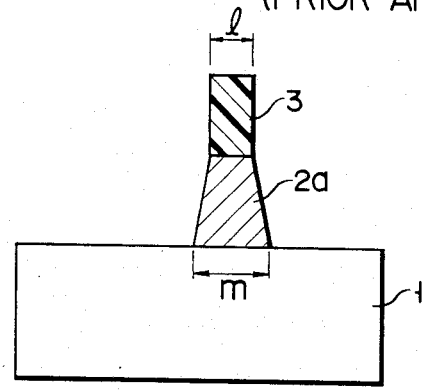
FIGS. 2A to 2E are sectional views illustrating drawbacks of the prior art conductor pattern forming method.
Figure 2B:
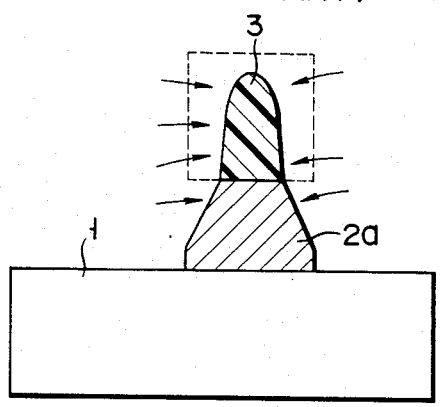
Figure 2C:
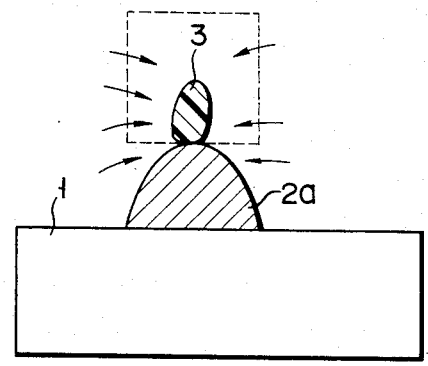
Figure 2D:
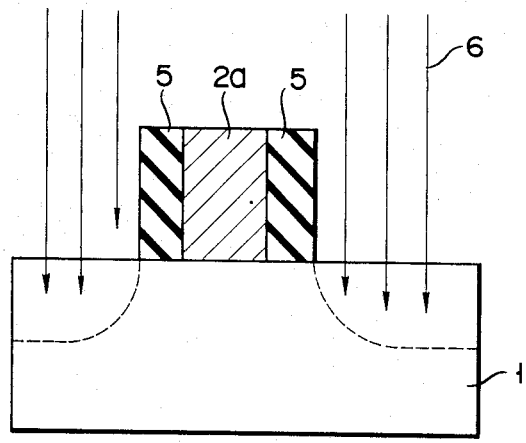
Figure 2E:
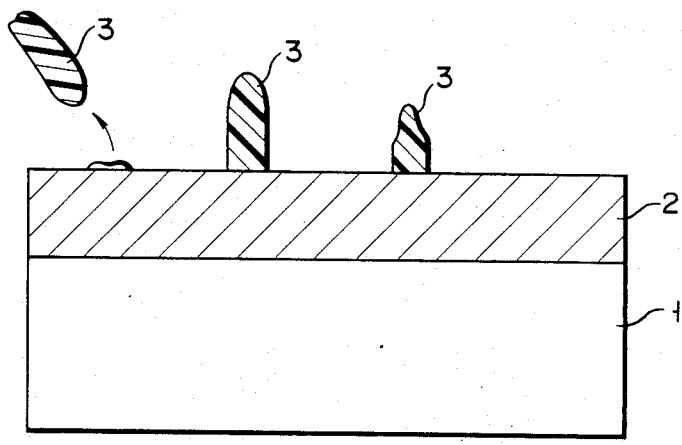
Figure 3A:
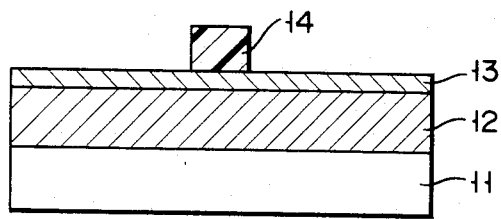
FIGS. 3A and 3B are sectional views showing another prior art method for forming a conductor pattern.
Figure 3B:
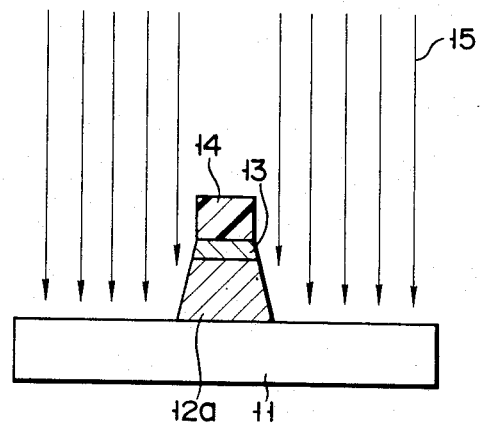

A method according to the present invention applied to the formation of a gate electrode of an MESFET using gallium arsenide for a semiconductor substrate will now be described in detail with reference to the accompanying drawings.

EXAMPLE 1

(First step) As shown in FIG. 4A, a semiconductor substrate 21 of gallium arsenide including a p-type layer 21a and an $n^-$-type layer 21b for channel region formation on the surface of the p-type layer 21a is prepared, and a conductive layer 22 of e.g. titanium nitride with a thickness of 5,000 angstroms is put on the $n^-$-type layer 21b.

The conductive layer 22 forms a Schottky junction at the surface in contact with the substrate 21.

(Second step) As shown in FIG. 4B, a photoresist film 23 is formed on the whole surface of the conductive layer 22 but a portion 22a thereof which is to constitute a gate electrode pattern.

(Third step) As shown in FIG. 4C, a masking metal film 24 of e.g. titanium is deposited to a thickness of 0.1 micron on the portion 22a and the photoresist film 23. In this case, the masking metal film 24 is thinned at the inner wall portion of an opening 23a of the photoresist film 23.

(Fourth step) When the photoresist film 23 is removed by means of a resist remover, as shown in FIG. 4D, those portions of the masking metal film 24 on the photoresist film 23 are also removed or lifted off, separating at its thinned portion on the inner wall portion of the opening 23a. Thus, a masking metal film portion 24a is left only on the portion 22a, forming the gate electrode pattern of the conductive layer 22.

(Fifth step) With use of the masking metal film portion 24a as a mask, the whole conductive layer 22 but the gate electrode pattern forming portion 22a is removed by reactive ion etching using $CF_4+O_2$ gas as an example of the anisotropic etching method, as shown in FIG. 4E. Thus, the electrode pattern (gate electrode) 22a is formed.

(Sixth step) As shown in FIG. 4F, the masking metal film portion 24a is removed as required.

(Seventh step) As shown in FIG. 4G, an insulating layer or a side wall 25 is formed as required on the lateral face of the electrode pattern 22a. Using the gate electrode 22a and the side wall 25 as a mask, an n-type impurity is injected at a high concentration into the semiconductor substrate 21 by ion implantation, thus forming an $n^+$region (source 27a and drain 27b).

In Example 1 described above, titanium, which is hardly affected by reactive ion etching when $CF_4+O_2$ gas is used as etching gas, is used for the etching mask. Therefore, the etching mask can be made thinner, and the dimensional change between the etching mask and the metal electrode pattern is reduced. Conventionally, a photoresist is used for the etching mask. It is very difficult, however, to form a thick and narrow photoresist film, so that a fine electrode pattern is difficult to form. According to Example 1, the photoresist film is stable enough to facilitate the formation of a fine electrode pattern, since it is formed over a wide region except the electrode pattern portion. Moreover, the etching mask is a metal (titanium) film which is highly resistant to reactive ion etching when $CF_4+O_2$ gas is used as etching gas. Even if reduced to e.g. 0.5 microns or less in thickness, therefore, the etching mask will never peel off during the etching process. Thus, it is possible to securely form a fine electrode pattern. Also, the metal or titanium film as the etching mask is barely susceptible to side etching by the reactive ion etching method using CF$_4$+O$_2$ gas. Therefore, the electrode pattern does not become trapezoidal or semicircular in vertical sectional shape due to side etching. Thus, the resistivity of the electrode pattern is not increased and the high-frequency characteristics are not degraded.

Since the lateral face of the electrode pattern is formed at right angles to the main surface of the semiconductor substrate, moreover, it is possible to form the side wall of the insulating material as aforesaid. Thus, the impurity can be accurately injected into the substrate by ion implantation, using the side wall and the electrode pattern as the mask.

In the MESFET obtained by the method of Example 1, the gate electrode can be made fine, permitting a reduction of channel length. Accordingly, the input capacitance and feedback capacitance are reduced for improved high-frequency characteristics, e.g., lower noise and greater gain.

The present invention is not limited to the embodiment described above, and the same effect may be obtained with use of reactive ion etching as the reactive ion etching method using chlorine-based gas in which the conductive layer is formed of aluminum and the masking metal film is a gold film with a thickness of 500 to 1,000 angstroms. Moreover, any number of other metal materials with high etching selectivity for reactive ion etching may be used individually for the conductive layer and the masking metal film with the same result. The conductive layer is not limited to metal, and may alternatively be formed of, for example, polycrystalline silicon.

EXAMPLE 2

In this example, an additional masking metal film is formed in advance of the formation of a photoresist film, and a first masking metal pattern is formed by lifting off the photoresist film in the same manner as in Example 1. Since this additional masking metal film is the first masking metal film that is formed in this embodiment of the invention, it will be termed as the "first masking metal film" and the subsequently formed masking film as the "second masking metal film". Thereafter, the first masking metal film is patterned with the aid of the first masking metal pattern as a mask, and a conductive layer is patterned with use of a second masking metal pattern resulting from the patterning of the first masking metal film as a mask.

(First step) As shown in FIG. 5A, a metal layer, e.g., a tungsten nitride layer 35, is formed to a thickness of 0.12 μm on the main surface of a semiconductor substrate 31 of gallium arsenide, constituting a Schottky junction with the substrate 31. Then, a gold layer 32 is formed to a thickness of 0.5 micron on the tungsten nitride layer 35. The tungsten nitride layer 35 and the gold layer 32 are metal layers which finally form a gate electrode G. The gold layer 32 serves to lower the resistivity of the gate electrode.

(Second step) As shown in FIG. 5B, a first masking conductive film or layer, e.g., a tungsten layer 36, is deposited to a thickness of 0.1 μm on the whole surface of the gold layer 32.

(Third step) As shown in FIG. 5C, a photoresist film 37 is formed on the whole surface of the tungsten layer 36 but a predetermined portion (mask portion) 36a thereof so that an opening 37a is formed over the mask portion 36a.

(Fourth step) As shown in FIG. 5D, a second masking conductive film or layer, e.g., a titanium layer 38, is deposited to a thickness of 0.1 μm on the photoresist film 37 and the mask portion 36a of the tungsten layer 36 exposed through the opening 37a. The titanium layer 38 is thinned at the portion on the side wall of the opening 37a.

(Fifth step) When the photoresist film 37 is removed by means of a resist remover, the titanium layer 38 is opened at the side wall portion of the opening 37a so that those portions of the titanium layer 38 on the photoresist film 37 are removed together with the film 37. Thus, a titanium layer portion 38a is left only on the mask portion 36a of the tungsten layer 36, as shown in FIG. 5E.

(Sixth step) As shown in FIG. 5F, those portions of the tungsten layer 36 except the mask portions 36a are removed by reactive ion etching using CF$_4$+O$_2$ gas with the aid of the titanium layer portion 38a as a mask.

(Seventh step) As shown in FIG. 5G, the gold layer 32 and the tungsten nitride layer 35 thereunder are selectively removed by anisotropic dry etching, e.g., ion milling using argon ions, with the aid of the titanium layer portion 38a and the mask portion 36a of the tungsten layer 36 as a mask. Thus, the gate electrode G is completed.

(Eighth step) As shown in FIG. 5H, the titanium layer portion 38a and the mask portion 36a of the tungsten layer 36 used as the mask are removed as required.

The following effects may be obtained with use of the above-mentioned processes in forming a gate electrode of an MESFET on a semiconductor substrate of gallium arsenide.

(1) In Example 2, a fine opening pattern of the same shape as the gate electrode pattern to be obtained is formed in the photoresist film, so that the photoresist film is put on the underlying metal layer (tungsten layer) with a wide contact area. Therefore, the mask pattern can reliably and easily made finer, permitting formation of a finer gate electrode pattern and hence a gate electrode with a short gate length. If the gate length is shortened, the contact area between the gate electrode and the semiconductor substrate (channel region) will be reduced in proportion. As a result, the input capacitance and feedback capacitance are reduced. Thus, it is possible to produce an MESFET with improved high-frequency characteristics, e.g., lower noise, higher transconductance, greater gain, etc.

When using digital signals, moreover, the input capacitance is reduced and transconductance is increased to improve the speed of response (switching speed).

(2) In Example 2, the first masking conductive film or layer (tungsten layer) is patterned by reactive ion etching with the aid of the second masking conductive film or layer (titanium layer) as a mask. The reactive ion etching permits substantial reduction of the dimensional change between the mask and the pattern of the etched material formed with the aid of the mask. It is therefore possible to pattern the first masking conductive layer according to the dimensions specified for the second masking conductive layer.

(3) In Example 2, moreover, the titanium layer as the second masking conductive layer, which is resistant to reactive ion etching in which CF$_4$+O$_2$ gas is used, is about 0.1 μm thick. This thickness is as small as about one-tenth that of the photoresist film used in the prior art example. Accordingly, the dimensional change is smaller when the titanium layer is used as a mask than in the conventional case where the photoresist film is used as the mask. Namely, in Example 2, the difference between the pattern widths of the mask and the electrode formed therewith is reduced.

Thus, in Example 2, the electrode patterning can be performed more accurately based on the dimensions determined of the mask than in the prior art case. Since the dimensional change is small, moreover, the vertical section of the formed gate electrode is substantially rectangular in shape, having its topside length substantially equal to the base length (gate length). If the base length (gate length) is taken as a basis, the vertical section of the rectangular gate electrode is greater than that of the conventional trapezoidal electrode whose topside is shorter than its base. Therefore, the gate electrode is formed by the method of Example 2 is lowered in resistivity.

(4) In Example 2, the titanium layer is resistant to ion milling using argon particles, so that the etching time can be made longer than in the prior art method which uses photoresist for the mask. Thus, it is possible to pattern even a relatively thick electrode.

(5) In Example 2, furthermore, the mask pattern of the tungsten layer as the first masking conductive layer is formed with use of the titanium layer as the second masking conductive layer as a mask, by reactive ion etching using $CF_4+O_2$ gas. By the reactive ion etching method, the chemical reactivity of the gas mixture is utilized for good control in side etching of the lateral face portions of the mask. Accordingly, the mask pattern of the tungsten layer as the first masking conductive layer, which is finer than the titanium layer mask as the second masking conductive layer, can be formed with good control.

Thus, the gate electrode can be made finer than the titanium film mask as the second masking conductive layer.

The present invention is not limited to the embodiment described above. For example, the first and second masking conductive layers may be formed from molybdenum and aluminum, respectively. Alternatively, the first and second conductive layers may be formed from gold and titanium, respectively, so that the titanium layer may be subjected to reactive ion etching using chlorine-based gas with the aid of the gold layer as a mask.

What is claimed is:

1. A method for forming a conductor pattern, comprising the steps of:

forming a conductive layer on a semiconductor substrate;
   forming a first masking metal film on the conductive layer;
   after said forming of said first masking metal film, forming a photoresist film on the conductive layer;
   removing that portion of the photoresist film located on a conductor pattern forming region of the conductive layer to form a surface structure including a remaining portion of the photoresist film;
   forming a second masking metal film over the entire surface structure;
   removing the remaining portion of the photoresist film along with that portion of the second masking metal film formed thereon so that a portion of the second masking film remains on the conductor pattern forming region of the conductive layer to form a first masking metal pattern;
   forming a second masking metal pattern by subjecting the first masking metal film to anisotropic etching using the first masking metal pattern as a mask; and
   selectively removing the conductive layer by anisotropic etching to form the conductor pattern.

2. The method according to claim 1, wherein said conductive layer is formed of a material adapted to constitute a Schottky junction with the semiconductor substrate.

3. The method according to claim 1, wherein said conductive layer is formed of a material selected from the group consisting of gold, titanium, aluminum, titanium nitride, tungsten nitride, polycrystalline silicon, a two-layer structure of titanium and gold, a two-layer structure of titanium nitride and gold, and a two-layer structure of tungsten nitride and gold.

4. The method according to claim 1, wherein said anisotropic etching for selectively removing the conductive layer is reactive ion etching or ion milling.

5. The method according to claim 1, wherein said second masking metal film is formed of a material selected from the group consisting of gold, titanium, aluminum, tungsten, and molybdenum.

6. The method according to claim 1, wherein said first masking metal film is formed of a material having etching selectivity for materials from which both the conductive layer and the second masking metal film are formed.

7. The method according to claim 6, wherein said first masking metal film is formed of a material selected from the group consisting of gold, titanium, aluminum, tungsten, and molybdenum.

* * * * *